United States Patent [19]

York et al.

[11] Patent Number: 5,010,736
[45] Date of Patent: Apr. 30, 1991

[54] COOLING SYSTEM FOR ENCLOSURES

[75] Inventors: Michael L. York, Fairfield; Steven E. Broerman, Mason, both of Ohio

[73] Assignee: Vortec Corporation, Cincinnati, Ohio

[21] Appl. No.: 509,902

[22] Filed: Apr. 16, 1990

[51] Int. Cl.⁵ .............................................. F25B 9/02
[52] U.S. Cl. ............................................ 62/5; 62/263
[58] Field of Search ............................ 62/5, 119, 263; 165/104.14

[56] References Cited

U.S. PATENT DOCUMENTS

| | | | |
|---|---|---|---|
| 3,308,634 | 3/1967 | Smith | 62/263 |
| 3,654,768 | 4/1972 | Inglis et al. | 62/5 |
| 3,871,188 | 3/1975 | Vold | 62/263 X |
| 4,333,517 | 6/1982 | Parro | 62/119 X |
| 4,505,328 | 3/1985 | Schmitt | 62/263 X |
| 4,706,739 | 11/1987 | Noren | 165/104.14 |
| 4,827,733 | 5/1989 | Dinh | 62/119 X |

Primary Examiner—Lloyd L. King
Attorney, Agent, or Firm—Tilton, Fallon, Lungmus & Chestnut

[57] ABSTRACT

A cooling system for cooling the inside of an enclosure includes a first cooling assembly with an evaporator and condenser for providing a first level of cooling for fluid in the enclosure. The second cooling assembly includes a vortex tube which supplements the cooling provided by the first assembly.

10 Claims, 3 Drawing Sheets

COOLING SYSTEM FOR ENCLOSURES

BACKGROUND OF THE INVENTION

1. Field Of The Invention

The present invention relates to a cooling system, and more particularly to a cooling system including a first and a second cooling assembly.

2. Description Of The Prior Art

Various enclosures require cooling, especially those containing devices susceptible to elevated temperatures. For example, electrical equipment having this susceptibility and operating in an unventilated enclosure heats the inside of the enclosures. This heating, if allowed to raise the temperature in the enclosure to a high level, may adversely effect the equipment. Moreover, heating caused by increases in the ambient temperature surrounding the enclosure may also damage the equipment.

Known means for cooling equipment enclosures include refrigerating apparatus, vortex tubes, and similar devices. For any particular application, such a device must provide sufficient cooling for the highest possible heating condition. Consequently, for normal conditions the device has an unnecessarily large cooling capacity, introducing an unnecessary expense and inefficiency.

Using a device with a cooling capacity sufficient for normal conditions but lower than that required for maximum heating results in another disadvantage. It places equipment in the enclosure at risk. The device will not cool the enclosure sufficiently during maximum heating. Accordingly, if the temperature in the enclosure rises above a predetermined level, the equipment in the enclosure may break down.

The cooling system of the present invention avoids the disadvantages outlined above. It provides a first level of cooling for normal operating conditions of equipment in an enclosure. It also provides a second, higher level of cooling for unexpected increases in the ambient temperature of the air surrounding the enclosure or in the heat loading conditions in the enclosure. Finally, it produces efficient and effective cooling of an enclosure.

SUMMARY OF THE INVENTION

In accordance with one embodiment, the cooling system of the present invention includes a housing defining a first chamber, an inlet for the first chamber, and an outlet. The inlet and the outlet communicate with an enclosure which the cooling system cools.

A first cooling assembly provides a predetermined level of cooling for the enclosure. It includes evaporator means disposed in the first chamber where it extracts heat from a fluid which flows from the enclosure through the inlet, around the evaporator means, out through the outlet, and into the enclosure. It also includes a condenser means which discharges the heat extracted by the evaporator means and transferred to it.

A second cooling assembly supplements the cooling provided by the first cooling assembly. It includes a vortex tube with a hot portion, a cold portion, and a generator portion disposed between the hot and cold portions. The cold portion discharges cold fluid into the enclosure to further cool the fluid inside the enclosure.

The second cooling assembly includes a temperature sensor disposed proximate the inlet of the first chamber. This sensor senses the temperature of fluid flowing into the first chamber from the enclosure. A thermostat receives the signal from the temperature sensor and activates the vortex tube at predetermined temperatures of the fluid.

While the following disclosure describes the invention in connection with one embodiment, one should understand that the invention is not limited to this embodiment. Furthermore, one should understand that the drawings are not to scale and that graphic symbols, diagrammatic representations or fragmentary views, in part, may illustrate the embodiment. In certain instances, the disclosure may not include details which are not necessary for an understanding of the present invention, such as conventional details of fabrication and assembly.

DETAILED DESCRIPTION OF THE DRAWINGS AND AN EMBODIMENT

Figure 2:
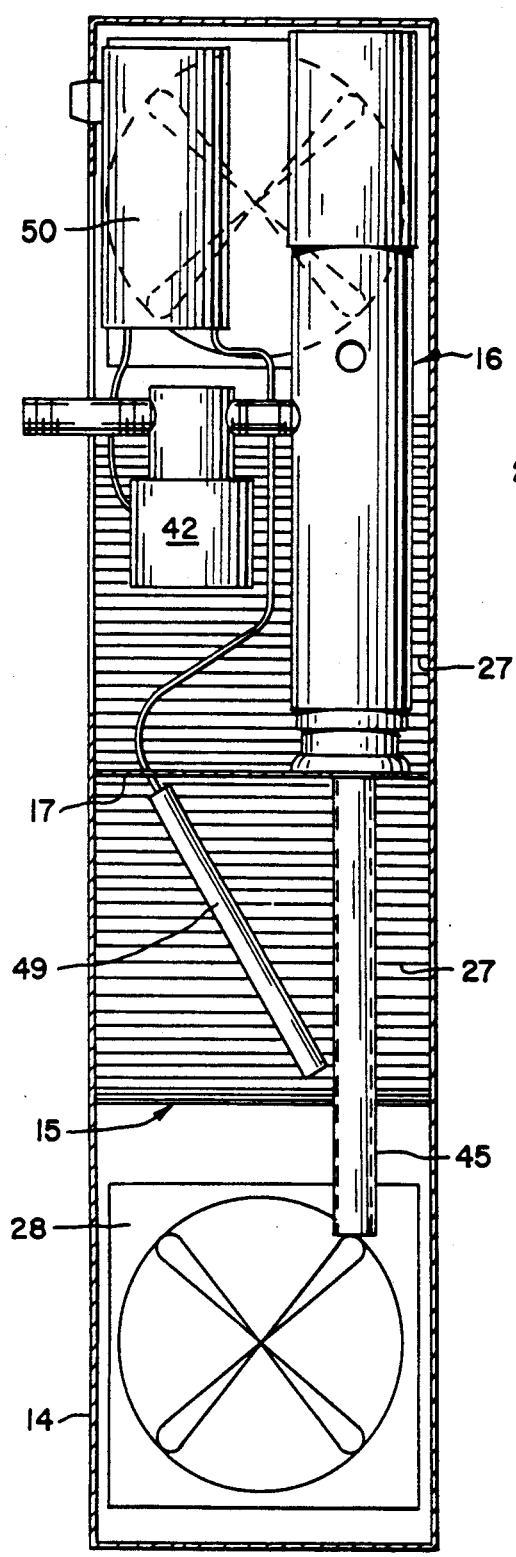
FIG. 2 is a sectional view taken along the line 2—2 in FIG. 1.
Figure 1:
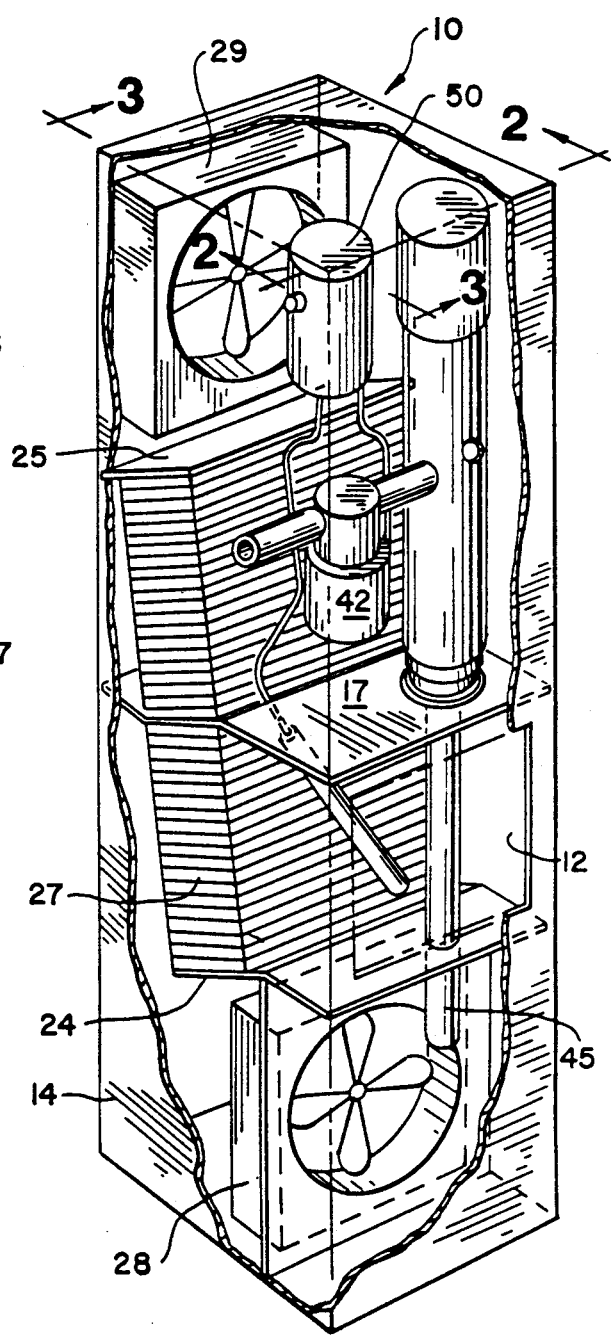
FIG. 1 is a perspective view of the cooling system of the present invention with a portion of its housing cut away to expose the components of the system.
Figure 3:
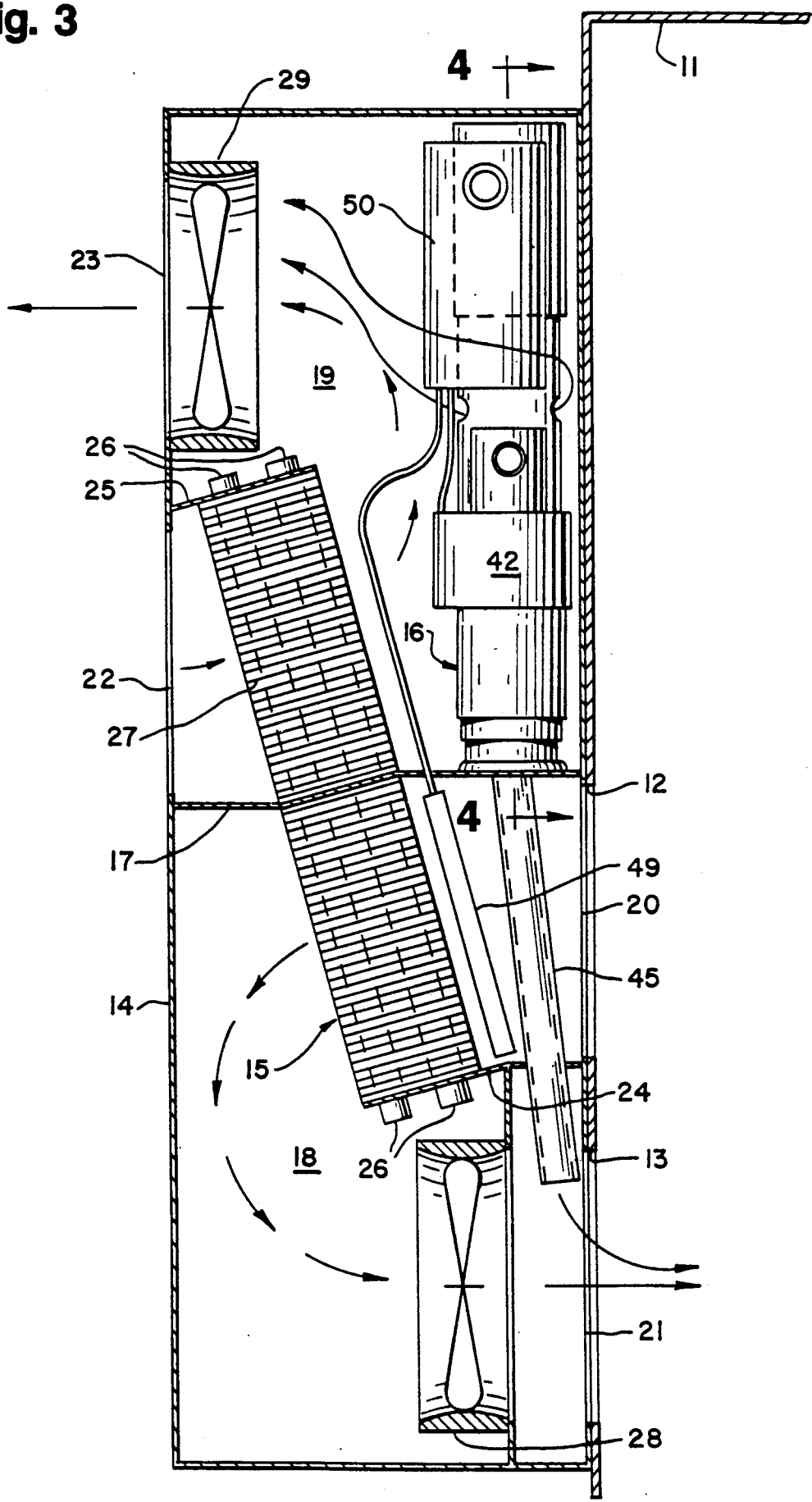
FIG. 3 is a sectional view taken along the line 3—3 in FIG. 1.

Turning now to the drawings, FIGS. 1-3 illustrate a cooling assembly 10 secured to a sidewall of an enclosure 11 which contains a fluid, e.g., air. The enclosure defines a pair of openings 12 and 13 through which the cooling system communicates with the enclosure 11. The cooling system 10 generally includes a housing 14, a first cooling assembly 15, and a second cooling assembly 16.

The housing 14 is an elongate, box-like structure made of aluminum sheet stock or any other material of high strength and rigidity. An internal partition 17 of the housing 14 divides its inner space into a first chamber 18 and a second chamber 19. The partition 17 is also made of aluminum sheet stock or any other material of high strength and rigidity.

The housing 14 defines an inlet 20 and an outlet 21 for the chamber 18 and an inlet 22 and an outlet 23 for the chamber 19. The inlet 20 and the outlet 21 communicate with the openings 12 and 13, respectively. An internal wall segment 24 disposed in the chamber 18 between the inlet 20 and the outlet 21 and a wall segment 25 disposed in the chamber 19 between the inlet 22 and the outlet 23 direct fluid, e.g., air, in a generally semi-circular path through each chamber. These internal wall segments also support the first cooling assembly 15.

The first cooling assembly 15 is a "heat pipe" heat exchanger including eight hollow, elongate copper pipes 26 closed at each end and containing an evaporating/condensing medium, e.g., a water methanol mixture placed in a vacuum in the pipes. The pipes 26 lie in co-extensive relation fixedly secured at opposite ends to the internal wall portions 24 and 25. Aluminum fins 27 welded or otherwise fixedly secured to the pipes along their length facilitate heat exchange between the medium inside the pipes and fluid flowing around the heat exchanger.

The heat exchanger 15 extends through a suitably sized opening in the partition 17 with its bottom half disposed in the chamber 18 and its top half disposed in the chamber 19. The bottom half of the heat exchangers is an evaporator portion and the top half is a condenser portion. As heated fluid from the enclosure moves across the evaporator portion, the medium in the heat pipes vaporizes from a liquid to a gas, causing the extraction of heat from the heated fluid. The vaporized medium rises to the top of the heat pipes where relatively cooler, ambient air which surrounds the enclosure cools the condenser portion, condensing the vapor back into a liquid. The liquid then returns or falls to the evaporator portion by gravity to complete a cycle.

As shown in FIG. 3, the heat pipe heat exchanger lies at a shallow angle to the vertical with the condenser generally disposed farther from the enclosure 11 than the evaporator. This arrangement allows the condenser portion (top portion) to lie above the evaporator portion (bottom portion) in installations where the cooling system 10 lies on top of the enclosure 11 rather than adjacent one of the sides.

A blower 28 fixedly secured within chamber 18 proximate the outlet 21, moves the air entering the chamber 18 around the evaporator portion of the heat exchanger 15 and out through the outlet 21. Similarly, a blower 29 fixedly secured within chamber 19 proximate the outlet 23 moves ambient air flowing into the chamber 19 through the inlet 22 around the condenser portion of the heat exchanger and out through the outlet 23. As the blowers 28 and 29 continue to operate, the exchanger repeats the evaporation/condensation cycle.

The first cooling assembly 15 provides a predetermined level of cooling for normal operating conditions of equipment disposed in the enclosure 11. During unstable conditions when maximum heating of the inside of the enclosure occurs, the second cooling assembly 16 supplements the cooling of the first cooling assembly 15. It increases the cooling to a second predetermined level.

Figure 4:
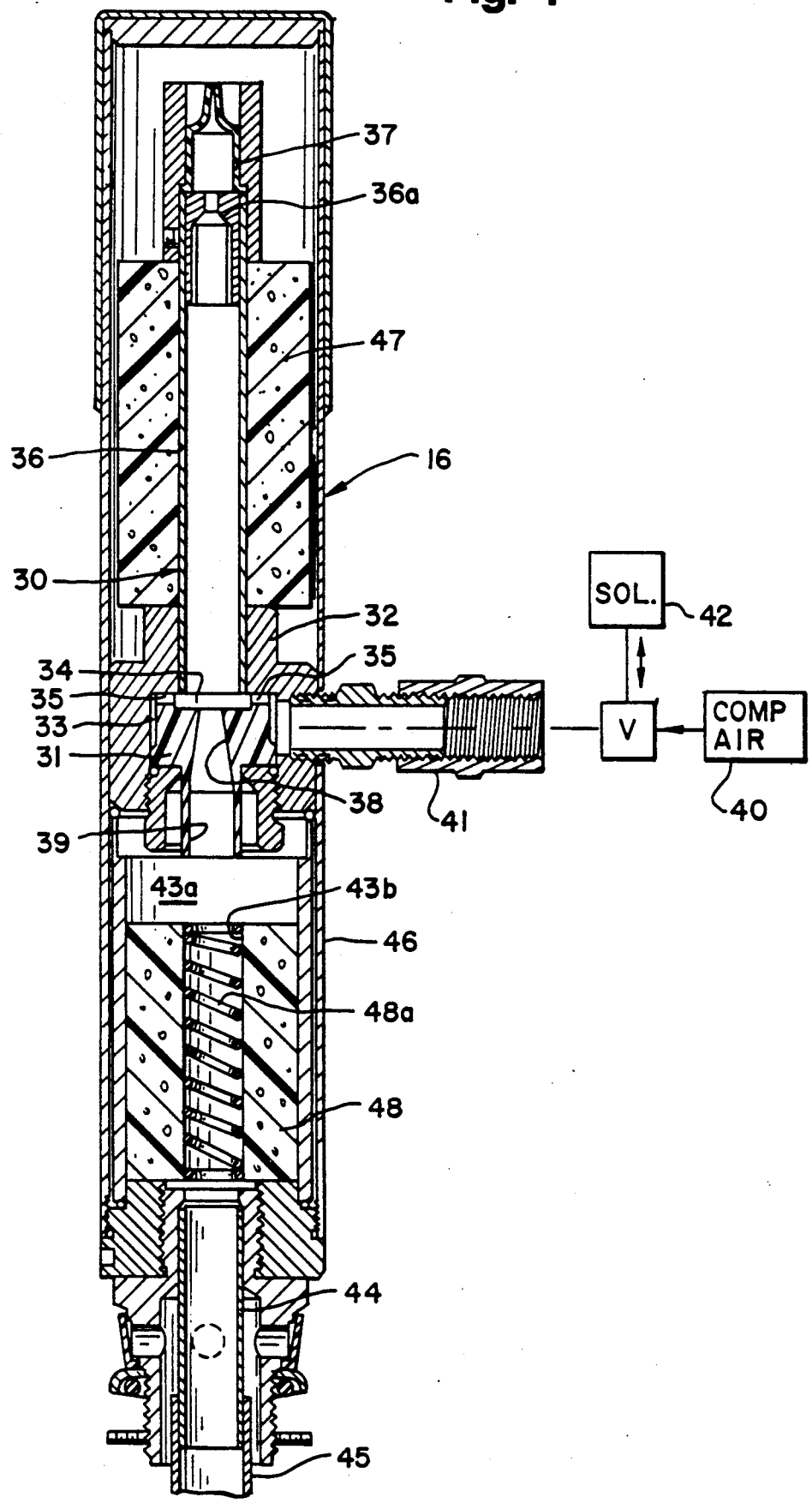
FIG. 4 is a sectional view taken along the line 4—4 in FIG. 3.

The second cooling assembly 16 (See FIG. 4) includes a vortex tube 30 which converts a supply of compressed air into two flow streams, one hotter than the supply of compressed air and the other colder than the supply of air. The vortex tube 30 includes a generator segment 31 which, along with a base member 32, defines an annular chamber 33 and a vortex chamber 34. The annular chamber 33 communicates with the vortex chamber 34 through nozzles 35.

A tube segment 36 is the "hot" portion of the vortex tube. One of its ends lies secured in a suitably sized opening in the base member 32 and communicates at that end with the vortex chamber 34. The other end supports a duckbill valve 37 or any other one way valve which prevents ambient air from entering the tube segment 36. Fluid flows in the segment 36 from the base member 32 to a constriction 36a in the tube segment 36 proximate the duckbill valve 37. The constriction 36a creates back pressure in the vortex tube as described below.

The generator 31 is molded nylon. In addition to partially defining the annular chamber 33 and the vortex chamber 34, it defines a bore which communicates with the vortex chamber 34. This bore includes a tapered portion 38 and a portion 39 of constant diameter. The part of the generator 31 which defines this bore is the cold portion of the vortex tube. It provides the cold fluid discharge to the enclosure, as described below.

A compressed air supply 40 supplies compressed air to the annular chamber 33 through a fitting 41; and a solenoid driven air valve 42 controls the supply of compressed air to this chamber. When the valve 42 allows flow into the vortex tube, compressed air first enters the chamber 33 and then into the nozzles 35 which inject the air tangentially into the vortex chamber 34. The air swirls in the vortex chamber 34 and becomes warmer as it proceeds through the tube segment 36, towards the hot end outlet at the duckbill valve 37. It flows out of the segment 36 and thus out of the vortex tube through the duckbill valve 37 and into the chamber 19.

The constriction 36a provided in the tube segment 36 creates enough back pressure in the vortex tube to force some of the air to the center of the tube and back through the cold end, i.e., bore portions 38 and 39. This air cools as it moves back through the vortex tube and, after moving back through the vortex chamber 34, discharges out of the bore portion 39, into an opening 43a, and then into a bore 43b. The cool air then flows through a tube segment 44 and into a tube 45 which directs the cool air to the outlet 21 of the chamber 18. U.S. Pat. No. 3,654,768 issued Apr. 11, 1972 to Inglis et al. for a "Vortex Tube Cooling System" discloses a vortex tube in greater detail and the applicant incorporates its disclosure to the present disclosure by this reference.

A housing 46 contains the vortex tube 30 and members 47 and 48 (e.g. urethane foam) disposed between the housing 46 and the various tube segments described above to suppress any noise generated by those members. The member 48 defines the bore 43b and a spring 48a lines the bore 43b and maintains it open. Suitable connecting means releasably secure the housing 46 to the housing 14. As shown in FIGS. 1-3, the housing 46 and the vortex tube 30 lie in the chamber 19. The tube 45, however, extends from one end of the housing 46, through the partition 17 and to the outlet 21 of the chamber 18.

A remote temperature sensing bulb 49 (e.g., a freon refrigerent-filled sensing bulb), disposed in the chamber 18 proximate the inlet 20, senses the temperature of the fluid flowing from the enclosure 11 into the chamber 18. A thermostat 50 receives the signal provided by the temperature sensor 49 through suitable connections (e.g., capillary copper tubing). This thermostat 50 activates the solenoid driven air valve 42 which controls the supply of compressed air into the vortex tube. At a predetermined temperature, the thermostat 50 opens the air valve 42 to allow compressed air into the vortex tube and cold air into the enclosure 11 through the tube 45.

In operation, the cooling system 10 of the present invention induces the flow of fluid from the enclosure through the chamber 18 with the blower 28 and the flow of ambient air through the chamber 19 with the blower 29. If a temperature differential exists across the enclosure 11, the medium in the heat pipe heat exchanger 15 vaporizes and then condenses. These reactions extract heat from the fluid flowing into chamber 18 and discharge heat into the ambient air flowing through chamber 19.

When an unexpected condition arises (e.g., increase in the ambient temperature of the air or in the heat loading within the enclosure), causing the enclosure temperature to rise, the sensor 49 detects the rise in temperature and opens the air valve 42. The compressed air then flows into the vortex tube which produces cold air. The cold air discharges into the enclosure 11 through the outlet 21 of the chamber 18, further cooling the enclosure.

The evaporator fan 28 allows the temperature sensor 49 to take a large sampling of the air in the enclosure 11, improving monitoring of enclosure temperatures. This sampling facilitates control of the temperature in the enclosure 11. In addition, the blower or fan 28 distributes the cold air produced by the vortex tube 30 and the heat exchanger 15 throughout the enclosure 11, effectively cooling the inside of the enclosure.

While the above description and the drawings disclose one embodiment, one should understand, of course, that the present invention is not limited to this embodiment. Those skilled in the art to which the invention pertains may make modifications and other embodiments employing the principles of this invention, particularly upon considering the foregoing teachings. Therefore, the applicant intends to cover any such modification and other embodiments which incorporate those features which constitute the essential features of this invention.

What is claimed is:

1. A cooling system for cooling the inside of an enclosure, said system comprising:
    a housing defining a first chamber and an inlet and outlet for the first chamber for communication with the enclosure;
    a first cooling assembly secured to the housing and including evaporator means disposed in the first chamber for extracting heat from a fluid which flows from the enclosure through the inlet of the first chamber and condenser means for discharging the heat extracted by the evaporator means; and
    a second cooling assembly including a vortex tube with a hot portion, a cold portion, and a generator portion disposed between the hot and cold portions, the cold portion being in fluid communication with the enclosure;
    said second cooling assembly including temperature sensing means disposed proximate the inlet of the first chamber for sensing the temperature of fluid flowing into the first chamber from the enclosure and control means connected to the temperature sensing means for controlling the operation of the vortex tube so that the vortex tube operates at a predetermined temperature of the fluid flowing into the first chamber.

2. The cooling system of claim 1, wherein the housing defines a second chamber for containing the condenser means and the vortex tube of the second cooling assembly and an inlet and outlet for the second chamber.

3. The cooling system of claim 2, further comprising first circulating means for circulating the fluid flowing into the first chamber from the enclosure through the first chamber, around the evaporator means and out through the outlet of the first chamber.

4. The cooling system of claim 3, wherein the first circulating means lies in the first chamber proximate the outlet of the first chamber.

5. The cooling system of claim 4, further comprising second circulating means for circulating a fluid disposed outside of the enclosure through the inlet of the second chamber, around the condenser means and out through the outlet of the second chamber.

6. The cooling system of claim 5, wherein the second circulating means lies in the second chamber proximate the outlet of the second chamber.

7. The cooling system of claim 1, wherein the distal end of the cold portion of the vortex tube lies proximate the outlet of the first chamber.

8. The cooling system of claim 1, wherein the evaporator means is one end of a heat pipe core having at least one tube with closed ends for containing an evaporating and condensing medium and fin means disposed around the tube, and wherein the condenser means is the opposite end of the heat pipe core.

9. In combination with an enclosure, a first and second cooling assembly in fluid communication with the enclosure, the first cooling assembly including evaporator means for extracting heat from a fluid which flows from the enclosure to the first cooling assembly and back to the enclosure and condenser means for discharging the heat extracted by the evaporator means, the second cooling assembly including a vortex tube with a cold portion for discharging a cold fluid into the enclosure, temperature sensing means for sensing the temperature of the fluid in the enclosure, and control means connected to the temperature sensing means for controlling the operation of the vortex tube so that the vortex tube operates at a predetermined temperature of the fluid in the enclosure.

10. A cooling system for cooling the inside of an enclosure, said system comprising:
    a housing defining a first chamber and an inlet and outlet for the first chamber for communication with the enclosure;
    a first cooling assembly secured to the housing and including evaporator means disposed in the first chamber for extracting heat from a fluid which flows from the enclosure through the inlet of the first chamber and condenser means for discharging the heat extracted by the evaporator means; and
    a second cooling assembly including a vortex tube with a hot portion, a cold portion, and a generator portion disposed between the hot and cold portions, the cold portion being in fluid communication with the enclosure;
    said second cooling assembly including temperature sensing means for sensing the temperature of fluid in the enclosure and control means connected to the temperature sensing means for controlling the operation of the vortex tube so that the vortex tube operates at a predetermined temperature of the fluid in the enclosure.

* * * * *